United States Patent
Nagayama et al.

(10) Patent No.: US 8,290,454 B2
(45) Date of Patent: Oct. 16, 2012

(54) POWER AMPLIFICATION DEVICE, AND TRANSMISSION DEVICE AND COMMUNICATION DEVICE BOTH USING THEREOF

(75) Inventors: Akira Nagayama, Tokyo (JP); Yasuhiko Fukuoka, Tokyo (JP)

(73) Assignee: Kyocera Corporation, Kyoto (JP)

( * ) Notice: Subject to any disclaimer, the term of this patent is extended or adjusted under 35 U.S.C. 154(b) by 114 days.

(21) Appl. No.: 13/056,636

(22) PCT Filed: Mar. 27, 2009

(86) PCT No.: PCT/JP2009/056389
§ 371 (c)(1),
(2), (4) Date: Jan. 28, 2011

(87) PCT Pub. No.: WO2010/013514
PCT Pub. Date: Feb. 4, 2010

(65) Prior Publication Data
US 2011/0130106 A1   Jun. 2, 2011

(30) Foreign Application Priority Data

Jul. 29, 2008   (JP) .................... 2008-194606

(51) Int. Cl.
*H04B 1/04*       (2006.01)
*H03F 3/68*       (2006.01)
(52) U.S. Cl. ................. 455/127.1; 330/124 R
(58) Field of Classification Search .......... 455/126, 455/127.1, 127.2, 127.3; 330/10, 107, 149, 330/151, 124 R
See application file for complete search history.

(56) References Cited

U.S. PATENT DOCUMENTS 5,365,187 A * 11/1994 Hornak et al. ............... 330/10
7,071,774 B2 * 7/2006 Hellberg .................. 330/124 R
(Continued)

FOREIGN PATENT DOCUMENTS
JP   03-099507   4/1991
(Continued)

OTHER PUBLICATIONS

Shi et al., "A 200-MHz IF BiCMOS Signal Component Separator for Linear LINC Transmitters," IEEE Journal of Solid-State Circuits (2000) 35(7):987-993.
(Continued)

*Primary Examiner* — Blane J Jackson
(74) *Attorney, Agent, or Firm* — Duane Morris LLP; Richard C. Kim (57) ABSTRACT

To provide a power amplification device having a function of preventing deviation of the amplitude and phase of an output signal having amplified envelope variation from a predetermined value, and a transmission device and a communication device both using the same. A power amplification device comprises a variable phase shifter circuit (10) for shifting a phase of an input signal; first and second adder circuits (11a), (11b) for generating first and second constant envelope signals, respectively; first and second amplifier circuits (12a), (12b); first and second amplitude detection circuits (13a), (13b) for detecting amplitudes; a first amplitude control circuit (20) for changing the amplitudes of the first and second constant envelope vector generating signals; an output adder circuit (14) for vector-adding the first and second amplified signals to generate an output signal; a shift amount control circuit (30) for controlling a shift amount of the variable phase shifter circuit; a gain control circuit (40) for controlling the gains of the first and second adder circuits; and a second amplitude control circuit (50) for changing the amplitudes of the first and second constant envelope vector generating signals.

8 Claims, 7 Drawing Sheets

U.S. PATENT DOCUMENTS

| | | | |
|---|---|---|---|
| 7,496,333 B2 * | 2/2009 | Matsuura et al. | 455/108 |
| 8,013,652 B2 * | 9/2011 | Nagayama | 327/231 |
| 2004/0101065 A1 * | 5/2004 | Hagh et al. | 375/297 |
| 2010/0240331 A1 * | 9/2010 | Nagayama | 455/127.1 |
| 2010/0240332 A1 * | 9/2010 | Nagayama | 455/127.1 |

FOREIGN PATENT DOCUMENTS

| | | |
|---|---|---|
| JP | 03-232307 | 10/1991 |
| JP | 06-022302 | 3/1994 |
| JP | 07-336147 | 12/1995 |
| JP | 2004-343665 | 12/2004 |
| JP | 2006-270882 | 10/2006 |
| JP | 2006-339888 | 12/2006 |

OTHER PUBLICATIONS

Shi et al., "A 200MHz IF BiCMOS chip for linear LINC transmitters," Solid-State Circuits Conference (1999) pp. 282-285.

Supplementary European Search Report for EP 09802759.2, mailed Mar. 14, 2012, 5 pages.

International Search Report for PCT/JP2009/056389, mailed on Apr. 28, 2009, 2 pages.

* cited by examiner

POWER AMPLIFICATION DEVICE, AND TRANSMISSION DEVICE AND COMMUNICATION DEVICE BOTH USING THEREOF

CROSS-REFERENCE TO RELATED APPLICATIONS

This is a U.S. National Phase Application of International Application No. PCT/JP2009/056389 filed Mar. 27, 2009, which claims priority to Japanese Patent Application No. 2008-194606 filed 29, 2008, the disclosures of which are incorporated herein by reference in their entirety.

TECHNICAL FIELD

The present invention relates to power amplification devices and transmission devices and communication devices both using the same, and in particular, to a power amplification device for converting an input single into two constant envelope signals and amplifying and then vector-adding the resultant constant envelope signals, and a transmission device and a communication device both using the same.

BACKGROUND ART

Among the power amplifying method for use in amplification or the like of transmission signals in communication devices, according to the LINC (Linear Amplification with Nonlinear Component) method, an input signal having envelope variation is converted into two constant envelope signals having a phase difference in accordance with the amplitude of the input signal, and the resultant constant envelope signals are amplified using non-linear amplifiers. Thereafter, the amplified constant envelope signals are vector-added to each other to thereby obtain an amplified input signal. According to this method, as the non-linear amplifier amplifies just constant envelope signals, it is possible to improve power amplification efficiency (see, e.g., Patent Document 1).
Patent Document 1: JP Publication No. Hei 6-22302

DISCLOSURE OF THE INVENTION

Problems to be Solved by the Invention

However, the power amplifier circuit disclosed in Patent Document 1 has a problem in that the circuit size results in large as an analog/digital convertor and a digital/analog convertor or the like are required for conversion of an input signal into two constant envelope signals in digital signal processing.

Figure 7:
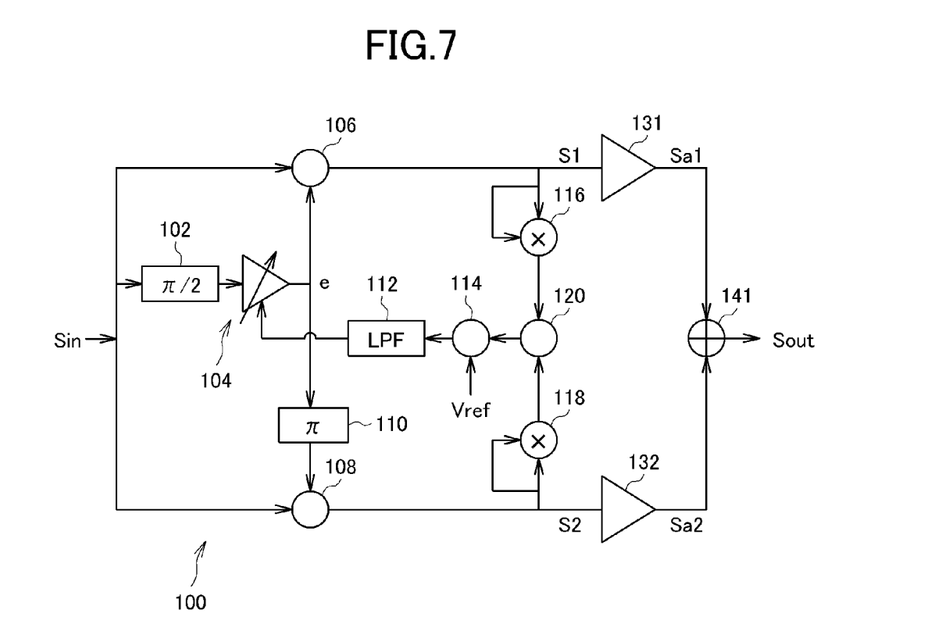
FIG. 7 is a block diagram schematically showing a structure of a power amplification device which is a premise of the present invention.
Figure 8:
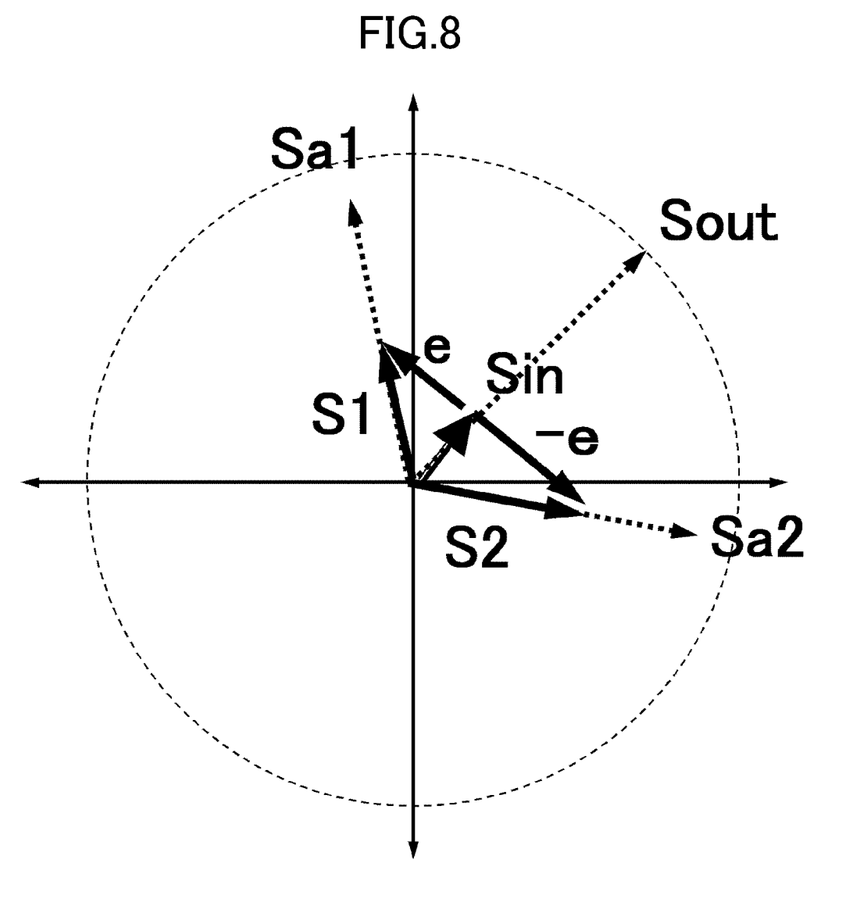
FIG. 8 is a vector diagram explaining a basic principle of signal conversion in a power amplification device according to the present invention.

In view of the above, the applicant has studied a circuit structure for converting an input signal into two constant envelope signals in analog signal processing, with the circuit structure shown in FIG. 7. This new power amplification device 100 advances the phase of an input signal Sin by $\pi/2$, using a phase shifter 102, to thereby obtain an orthogonal signal, then amplifies the resultant signal, using a variable gain amplifier 104, to thereby generate a signal (a first constant envelope vector generating signal e), and vector-adds the resultant first constant envelope vector generating signal e to the input signal Sin, using an adder circuit 106, to thereby generate a first constant envelope signal S1. In addition, the first constant envelope vector generating signal e is delayed by $\pi$, using a phase shifter 110, to thereby generate a reverse phase signal (a second constant envelope vector generating signal −e) in analog signal processing, and the second constant envelope vector generating signal −e is vector-added to the input signal Sin, using an adder circuit 108, to thereby generate a second constant envelope signal S2. Then, the amplitude (specifically, the square of the amplitude) of the first constant envelope signal S1 and that of the second constant envelope signal process S2 are detected, using respective mixers (amplitude detection circuits) 116, 118, and then added to each other in an adder circuit 120. Moreover, the difference between the added value and a predetermined voltage Vref is obtained in an adder circuit 114, and then applied to a low pass filter 112. An output of the low pass filter 112 is input via a buffer amplifier (not shown) as a gain control signal of a variable gain amplifier 104. With this structure, the gain of the variable gain amplifier 104 is given feedback control such that the sum of the squared amplitude of the first constant envelope signal S1 and that of the second constant envelope signal process S2 remains as a constant value so that the amplitude of the first constant envelope signal S1 and that of the second constant envelope signal S2 are set to a predetermined value. With the above, the first constant envelope signal S1 and the second constant envelope signal S2 can be made into constant envelope signals. The first constant envelope signal S1 and the second constant envelope signal S2 are amplified using amplification devices 131, 132, respectively, to thereby obtain a first amplified signal Sa1 and a second amplified signal Sa2. Then, the first amplified signal Sa1 and the second amplified signal Sa2 are added to each other, using a vector adder circuit 141, whereby an output signal Sout having amplified envelope variation can be obtained (see FIG. 8).

Figure 9:
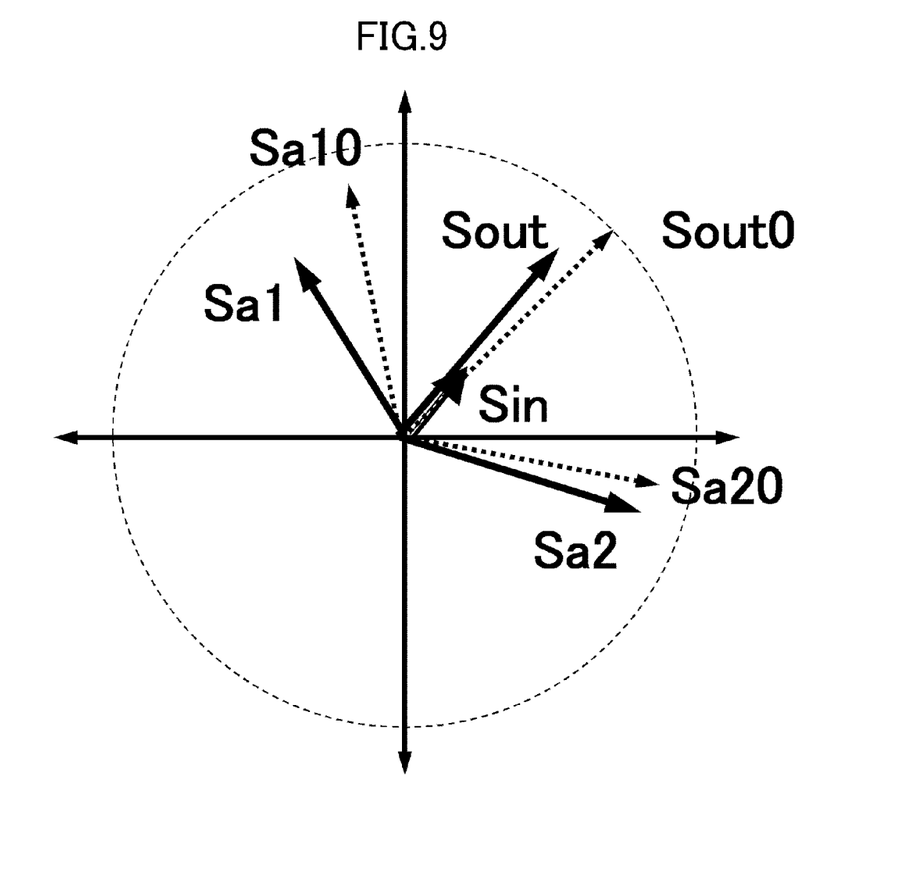
FIG. 9 is block diagram explaining a problem suffered by a power amplification device which is a premise of the present invention.

Such a structure, however, has a problem in that, when the gain of the adder circuit 106 is different from that of the adder circuit 108, the amplitude of the first constant envelope signal S1 results in different from that of the second constant envelope signal S2. Further, there is another problem in that, when the impedance of the adder circuit 106 is different from that of the adder circuit 108, the phase difference between the input signal Sin and the first constant envelope signal S1 results in different from that between the input signal Sin and the second constant envelope signal S2. As a result, the phase of the first constant envelope signal S1 and that of the second constant envelope signal S2 are not symmetrical relative to the phase of the input signal Sin. There is a still further problem in that, when the impedances of the transistors included in two respective amplifiers for amplifying the first constant envelope signal S1 and the second constant envelope signal S2 are not identical, different phases are resulted in the shift amount between the respective amplifiers. These problems lead to a yet further problem in that the amplitude and phase of the output signal Sout having amplified envelope variation deviate from predetermined values, as shown in FIG. 9. That is, the deviation of the first amplified signal Sa1 and the second amplified signal Sa2 from a predetermined first amplified signal Sa10 and a predetermined second amplified signal Sa20, respectively, leads to deviation of the output signal Sout from a predetermined output signal Sout0.

The present invention has been conceived in view of the above described problems suffered by a conventional technique, and aims to provide a power amplification device having a function of preventing deviation of the amplitude and phase of an output signal having amplified envelope variation from predetermined values, and also to provide a transmission device and a communication device both using such a power amplification device.

Means for Solving the Problems

A power amplification device according to the present invention comprises a variable phase shifter circuit for changing a phase of an input signal having envelope variation to thereby generate a base signal; a first adder circuit for vector-adding a first constant envelope vector generating signal having a phase advanced by $\pi/2$ from the base signal to the base signal to thereby generate a first constant envelope signal; a second adder circuit for vector-adding a second constant envelope vector generating signal having a phase delayed by $\pi/2$ from the base signal to thereby generate a second constant envelope signal; a first amplifier circuit for amplifying the first constant envelope signal to thereby generate a first amplified signal; a second amplifier circuit for amplifying the second constant envelope signal to thereby generate a second amplified signal; a first amplitude detection circuit for detecting an amplitude of the first amplified signal and generating a first detected amplitude signal; a second amplitude detection circuit for detecting an amplitude of the second amplified signal and generating a second detected amplitude signal; a first amplitude control circuit for changing an amplitude of the first constant envelope vector generating signal and an amplitude of the second constant envelope vector generating signal, based on the first detected amplitude signal and the second detected amplitude signal, respectively; an output adder circuit for vector-adding the first amplified signal and the second amplified signal to thereby generate an output signal having amplified envelope variation; and a shift amount control circuit for detecting a phase difference between the input signal and the output signal and generating a shift amount control signal for controlling a shift amount by the variable phase shifter circuit according to the phase difference.

In a power amplification device having the above described structure according to the present invention, the shift amount control circuit may include a phase difference detection circuit for detecting a phase difference between the input signal input and the output signal and generating a detected phase difference signal having a voltage in accordance with the phase difference, and a voltage shift circuit for adding a predetermined voltage shift signal and the detected phase difference signal to thereby generate the shift amount control signal.

A power amplification device having the above described structure according to the present invention may further comprise a gain control circuit for controlling gains of the first adder circuit and the second adder circuit, based on the first detected amplitude signal and the second detected amplitude signal.

In a power amplification device having the above described structure according to the present invention, the first detected amplitude signal may have a voltage in accordance with an amplitude of the first amplified signal, the second detected amplitude signal may have a voltage in accordance with an amplitude of the second amplified signal, and the gain control circuit may receive the first detected amplitude signal and the second detected amplitude signal, and generate a first gain control signal and a second gain control signal, the first gain control signal, which is used for controlling the gain of the first adder circuit, has a voltage obtained by subtracting a voltage of the first detected amplitude signal from a predetermined reference voltage, the second gain control signal, which is used for controlling the gain of the second adder circuit, has a voltage obtained by subtracting a voltage of the second detected amplitude signal from the predetermined reference voltage.

A power amplification device having the above described structure according to the present invention may further comprise a second amplitude control circuit for changing amplitudes of the first constant envelope vector generating signal and the second constant envelope vector generating signal, based on an amplitude of the input signal and an amplitude of the output signal.

In a power amplification device having the above described structure according to the present invention, the second amplitude control circuit may include an input amplitude detection circuit for detecting the amplitude of the input signal and generating a detected input amplitude signal having a voltage in accordance with the amplitude of the input signal, an output amplitude detection circuit for detecting the amplitude of the output signal and generating a detected output amplitude signal having a voltage in accordance with the amplitude of the output signal, an attenuation circuit for outputting a second detected output amplitude signal obtained by attenuating the detected output amplitude signal by a predetermined percentage, and an amplitude control signal generating circuit for receiving the detected input amplitude signal and the second detected output amplitude signal, and generating an amplitude control signal having a voltage obtained by subtracting a voltage of the second detected output amplitude signal from a voltage of the detected input amplitude signal, the amplitude control signal is used for controlling an amplitude of the first constant envelope vector generating signal and an amplitude of the second constant envelope vector generating signal.

A transmission device according to the present invention comprises a transmission circuit; the power amplification device having any of the above described structures; and an antenna connected to the transmission circuit via the power amplification device.

A communication device according to the present invention comprises a transmission circuit; the power amplification device having any of the above described structures; an antenna connected to the transmission circuit via the power amplification device; and a receiving circuit connected to the antenna.

Effect of the Invention

According to a power amplification device of the present invention, it is possible to have the phase of an input signal matched to that of an output signal.

BEST MODE FOR CARRYING OUT THE INVENTION

In the following, a power amplification device according to the present invention and a transmission device and a communication device both using the same will be described in detail with reference to the accompanying diagrams.

[First Embodiment]

Figure 1:
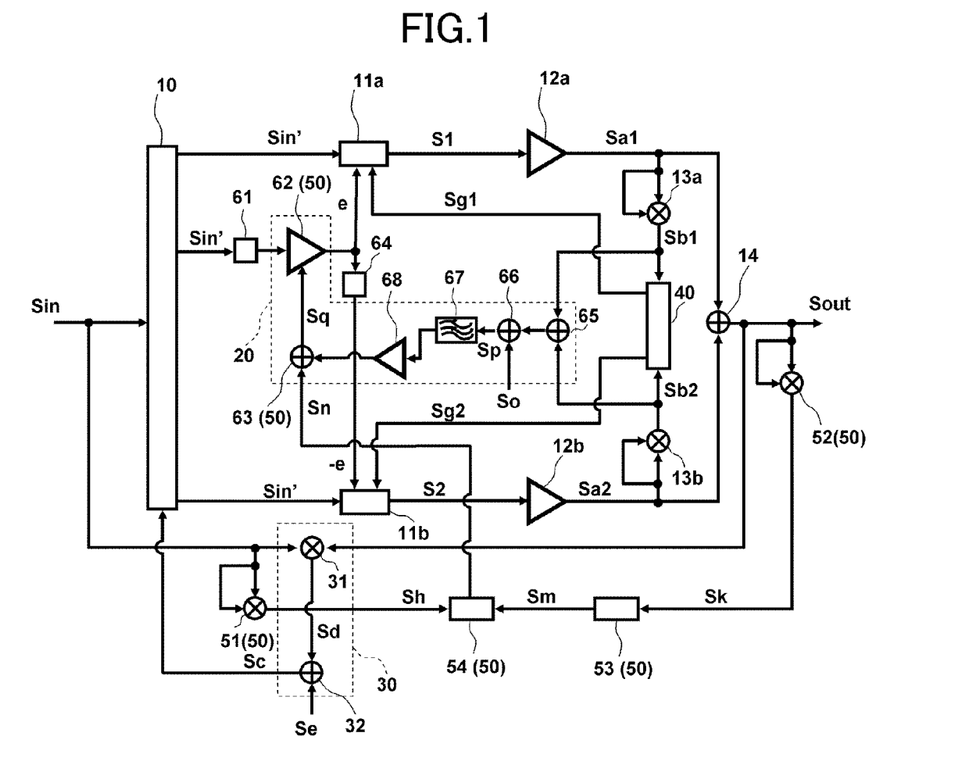
FIG. 1 is a block diagram schematically showing one example of a power amplification device according to an embodiment of the present invention.

FIG. 1 is a block diagram schematically showing a power amplification device according to an embodiment of the present invention. As shown in the diagram, in a power amplification device in this embodiment, an input signal Sin is input to a variable phase shifter circuit 10, which then shifts the phase of the input signal Sin according to a phase control signal Sc, and outputs the resultant signal as a base signal Sin'. The base signal Sin' is input to a phase shifter 61. The phase shifter 61 is a circuit that advances the phase of the base signal Sin' by π/2, an output of which is input to a variable gain amplifier 62. The variable gain amplifier 62 additionally receives an output signal from an adder 63 as a variable gain control signal Sq so that the amplification gain thereof is controlled based on the variable gain control signal Sq. An output of the variable gain amplifier 62 is input as a first constant envelope vector generating signal e to a first adder circuit 11a, which then vector-adds the output to the base signal Sin'. With the above, a first constant envelope signal S1 is output from the first adder circuit 11a. The first constant envelope vector generating signal e is also input to a 180° phase shifter 64, which then inverts the phase of the first constant envelope vector generating signal e to thereby generate a second constant envelope vector generating signal −e. The second constant envelope vector generating signal −e is input to a second adder circuit 11b, which then vector-adds the signal −e to the base signal Sin'. With the above, a second constant envelope signal S2 is output from the second adder circuit 11b.

The first constant envelope signal S1 output from the first adder circuit 11a is amplified in the first amplifier circuit 12a before being output as a first amplified signal Sa1. The first amplified signal Sa1 is supplied to a first amplitude detection circuit 13a, which then generates a first detected amplitude signal Sb1 having a DC voltage signal indicating the squared value of the amplitude of the first amplified signal Sa1. Similarly, the second constant envelope signal S2 output from the second adder circuit 11b is amplified in a second amplifier circuit 12b before being output as a second amplified signal Sa2. The second amplified signal Sa2 is supplied to a second amplitude detection circuit 13b, which then generates a second detected amplitude signal Sb2 having a DC voltage signal indicating the squared value of the amplitude of the second amplified signal Sa2. Note that, a Gilbert cell mixer, for example, can be used as the first amplitude detection circuit 13a and the second amplitude detection circuit 13b. The first detected amplitude signal Sb1 and the second detected amplitude signal Sb2 are input to an adder 65 and added to each other before being output as a detected amplitude signal. The detected amplitude signal is then input to an adder 66, which then generates a variable gain control base signal Sp having a voltage obtained by subtracting the voltage of the detected amplitude signal from the voltage of a reference signal So. The variable gain control base signal Sp is input to an adder 63 via a low pass filter 67 and a buffer amplifier 68, and then supplied to the variable gain amplifier 62 as the variable gain control signal Sq output from the adder 63. Note that the adder 65, the adder 66, the low pass filter 67, the buffer amplifier 68, the adder 63, and the variable gain amplifier 62 together constitute a first amplitude control circuit 20.

According to a power amplification device having the above described structure in this embodiment, the voltage of the variable gain control base signal Sp and that of the variable gain control signal Sq based on the variable gain control base signal Sp will increase or decrease in an inverted manner according to an increase or a decrease of the amplitudes of the first amplified signal Sa1 and the second amplified signal Sa2. Therefore, by controlling the gain of the variable gain amplifier 62 by utilizing the variable gain control signal Sq, it is possible to generate the first constant envelope vector generating signal e and second constant envelope vector generating signal −e that increase or decrease in an inverted manner according to an increase or a decrease of the amplitude of the input signal Sin, and it is thus possible to generate the first constant envelope signal S1 and second constant envelope signal S2 that are constant envelope signals.

In a power amplification device in this embodiment, the first detected amplitude signal Sb1 output from the first amplitude detection circuit 13a and the second detected amplitude signal Sb2 output from the second amplitude detection circuit 13b are both input to a gain control circuit 40. The gain control circuit 40 generates a first gain control signal Sg1 having a voltage obtained by subtracting the voltage of the first detected amplitude signal Sb1 from a reference voltage and a second gain control signal Sg2 having a voltage obtained by subtracting the voltage of the second detected amplitude signal Sb2 from the reference voltage. The first gain control signal Sg1 is input to the first adder circuit 11a to control the gain thereof to thereby control the amplitude of the first constant envelope signal S1. Meanwhile, the second gain control signal Sg2 is input to the second adder circuit 11b to control the gain thereof to thereby control the amplitude of the second constant envelope signal S2. Note that an image rejection double balance mixer or the like, for example, can be used as the first adder circuit 11a, the second adder circuit 11b, and the output adder circuit 14, and that a comparator can be used as the gain control circuit 40. Then, the first gain control signal Sg1 and the second gain control signal Sg2 are connected to the respective current source gate terminals of the respective mixers constituting the first adder circuit 11a and the second adder circuit 11b, respectively, to control a current supplied from a constant current source, whereby the gain of the first adder circuit 11a and that of the second adder circuit 11b can be controlled.

According to a power amplification device having the above described structure in this embodiment, with an arrangement such that the voltage of the first detected amplitude signal Sb1 and the second detected amplitude signal Sb2 at the time when the amplitudes of the first amplified signal Sa1 and the second amplified signal Sa2 are identical to a predetermined amplitude is set as a reference voltage, the voltage of the first gain control signal Sg1 and that of the second gain control signal Sg2 will have a polarity opposite to the deviation of the amplitudes of the first amplified signal Sa1 and the second amplified signal Sa2 from a reference amplitude (that is, a negative (−) polarity for an amplitude of the first amplified signal Sa1 and the second amplified signal Sa2 being larger than the predetermined amplitude and a positive (+) polarity for an amplitude being smaller). Then, by controlling the gain of the first adder circuit 11a, based on the first gain control signal Sg1 having a voltage having a polarity opposite to the deviation of the amplitude of the first amplified signal Sa1 from the predetermined amplitude, it is possible to change the amplitude of the first constant envelope signal S1 to thereby match the amplitude of the first amplified signal Sa1 to the predetermined amplitude. Similarly, by controlling the gain of the second adder circuit 11b, based on the second gain control signal Sg2 having a voltage having a polarity opposite to the deviation of the amplitude of the second amplified signal Sa2 from the predetermined amplitude, it is possible to change the amplitude of the second constant envelope signal S2 to thereby match the amplitude of the second amplified signal Sa2 to the predetermined amplitude. With the above, as the amplitude of the first amplified signal Sa1 and that of the second amplified signal Sa2 are both matched to the predetermined amplitude, the second effect of an amplification device according to the present invention, that is, an effect of matching the amplitude of the first amplified signal Sa1 to that of the second amplified signal Sa2, can be obtained.

In a power amplification device in this embodiment, the input signal Sin and the output signal Sout are also input to a phase difference detection circuit 31, which then generates a detected phase difference signal Sd having a DC voltage in accordance with the phase difference between the input signal Sin and the output signal Sout. The detected phase difference signal Sd is input to a voltage shift circuit 32, which then generates a phase control signal Sc having a DC voltage obtained by adding the DC voltage of the detected phase difference signal Sd and that of a voltage shift signal Se. Similar to the detected phase difference signal Sd, the phase control signal Sc also has a DC voltage in accordance with the phase difference between the input signal Sin and the output signal Sout, and is input to the variable phase shifter circuit 10 to control the shift amount thereof. Note that the phase difference detection circuit 31 and the voltage shift circuit 32 together constitute a shift amount control circuit 30. A mixer, for example, can be used as the phase difference detection circuit 31, and an adder circuit, for example, can be used as the voltage shift circuit 32.

According to a power amplification device having the above described structure in this embodiment, by appropriately setting the DC voltage of the voltage shift signal Se, it is possible to set the DC voltage of the phase control signal Sc in the optimum voltage range for controlling the shift amount of the variable phase shifter circuit 10. Further, by controlling the shift amount by the variable phase shifter circuit 10, based on the phase control signal Sc having a DC voltage in accordance with the phase difference between the input signal Sin and the output signal Sout, it is possible to obtain the first effect of an amplification device of the present invention, that is, an effect of eliminating the phase difference between the input signal Sin and the output signal Sout to thereby match the phases of these signals to each other.

Further, in a power amplification device in this embodiment, the input signal Sin is input to an input amplitude detection circuit 51, which then generates a detected input amplitude signal Sh having a voltage in accordance with the amplitude of the input signal Sin. In addition, the output signal Sout is input to an output amplitude detection circuit 52, which then generates a detected output amplitude signal Sk having a voltage in accordance with the amplitude of the output signal Sout. The detected output amplitude signal Sk is input to an attenuation circuit 53, which then attenuates the detected output amplitude signal Sk by a predetermined percentage and generates a second detected output amplitude signal Sm having a voltage corresponding to the voltage at the time when an amplitude obtained by subtracting the amount amplified by the first amplifier circuit 12a and the second amplifier circuit 12b from the amplitude of the output signal Sout is detected. The detected input amplitude signal Sh and the second detected output amplitude signal Sm are input to an amplitude control signal generating circuit 54, which then generates an amplitude control signal Sn having a voltage obtained by subtracting the voltage of the second detected output amplitude signal Sm from the voltage of the detected input amplitude signal Sh. The amplitude control signal Sn is input to the adder 63 and added to the variable gain control base signal Sp having passed through the low pass filter 67 and the buffer amplifier 68 to thereby generate the variable gain control signal Sq. The variable gain control signal Sq is input to the variable gain amplifier 62 to control the gain thereof to thereby control the amplitudes of the first constant envelope vector generating signal e and the second constant envelope vector generating signal −e. Note that the input amplitude detection circuit 51, the output amplitude detection circuit 52, the attenuation circuit 53, the amplitude control signal generating circuit 54, the adder 63, and the variable gain amplifier 62 together constitute a second amplitude control circuit 50, and that a comparator, for example, can be used as the amplitude control signal generating circuit 54.

According to a power amplification device having the above described structure in this embodiment, the amplitude control signal generating circuit 54 generates the amplitude control signal Sn having a voltage obtained by subtracting the voltage of the second detected output amplitude signal Sm from the voltage of the detected input amplitude signal Sh, so that the voltage of the amplitude control signal Sn has a voltage having a polarity opposite to the deviation of the amplitude of the output signal Sout relative to a predetermined value which is based on the amplitude of the input signal Sin. Therefore, by using the amplitude control signal Sn having such a voltage to control the amplitudes of the first constant envelope vector generating signal e and the second constant envelope vector generating signal −e, it is possible to obtain the third effect of an amplification device according to the present invention, that is, an effect of matching the amplitude of the output signal Sout to the predetermined value.

According to a power amplification device in this embodiment, as the first to third effects can all be obtained, it is possible to prevent deviation of the amplitude and phase of the output signal Sout having amplified envelope variation from respective predetermined values. This will be described referring to FIGS. 2 to 4 and FIG. 9.

Figure 2:
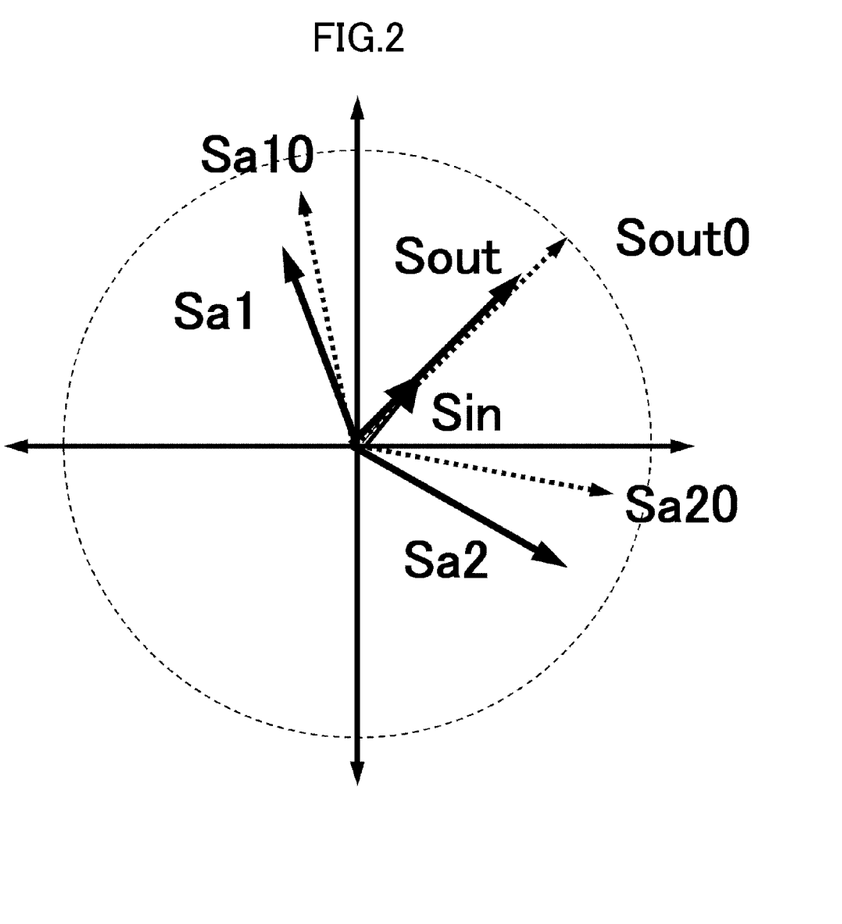
FIG. 2 is a vector diagram explaining an effect of a power amplification device according to the present invention.
Figure 3:
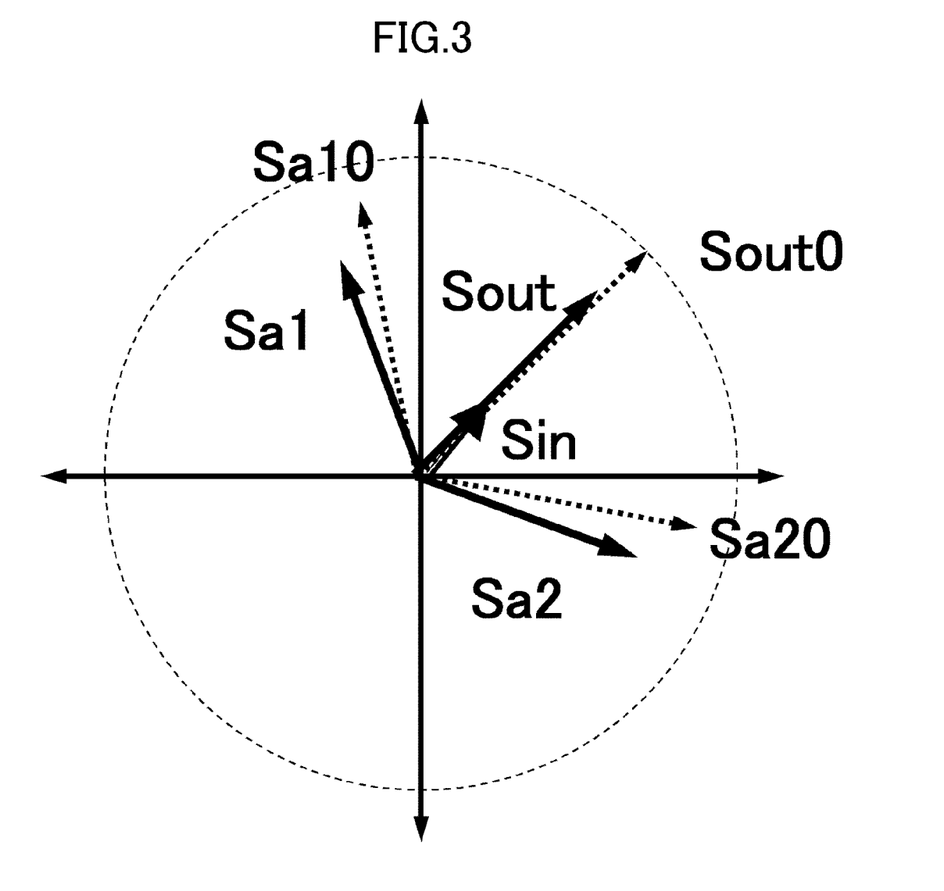
FIG. 3 is a vector diagram explaining an effect of a power amplification device according to the present invention.
Figure 4:
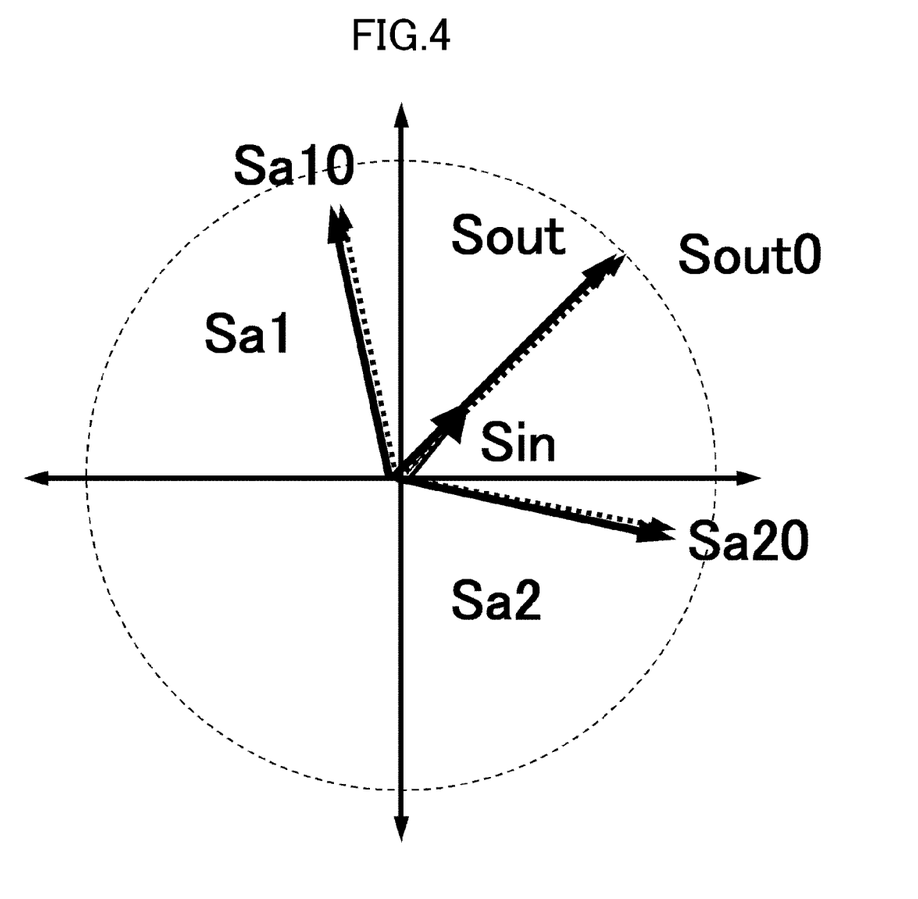
FIG. 4 is a vector diagram explaining an effect of a power amplification device according to the present invention.

Initially, with the first effect of an amplification device according to the present invention, that is, an effect of eliminating the phase difference between the input signal Sin and the output signal Sout so that the phases of these signals Sin and Sout are matched to each other, the condition shown in FIG. 9, in which the amplitude and phase of the output signal Sout are deviated from those of a predetermined output signal Sout0 due to the deviation of the amplitude and phase of the first amplified signal Sa1 and the second amplified signal Sa2 from those of the predetermined first amplified signal Sa10 and the predetermined second amplified signal Sa20, respectively, can be corrected to the condition shown in FIG. 2, in which the phase of the output signal Sout is matched to that of the predetermined output signal Sout0. Thereafter, with the second effect of an amplification device according to the present invention, that is, an effect of matching the amplitude of the first amplified signal Sa1 to that of the second amplified signal Sa2, the condition shown in FIG. 2 can be corrected to the condition shown in FIG. 3, in which the amplitude of the first amplified signal Sa1 is matched to that of the second amplified signal Sa2. Finally, with the third effect of an amplification device according to the present invention, that is, an effect of matching the amplitude of the output signal Sout to a predetermined value, the condition shown in FIG. 3 can be corrected to the condition shown in FIG. 4, in which the amplitude and phase of the output signal Sout are matched to those of the predetermined output signal Sout0. Note that in order to realize the third effect of an amplification device according to the present invention, it is desirable that the first and second effects of the amplification device according to the present invention are already realized. Regarding this point, according to the structure of an amplification device according to the present invention, the first and second effects are realized automatically before the third effect is realized in the amplification device according to the present invention due to a difference in the response speed.

As described above, as a power amplification device in this embodiment comprises the variable phase shifter circuit 10 for changing the phase of the input signal Sin having envelope variation to thereby generate the base signal Sin' and the shift amount control circuit 30 for detecting the phase difference between the input signal Sin and the output signal Sout and generating the shift amount control signal Sc for controlling the shift amount by the variable phase shifter circuit 10 according to the phase difference, it is possible to change the shift amount of the variable phase shifter circuit 10 according to the phase difference between the input signal Sin and the output signal Sout, and it is thus possible to obtain the first effect, that is, an effect of matching the phase of the input signal Sin to that of the output signal Sout. Then, with the above, it is possible to reduce the deviation of the amplitude and phase of the output signal Sout having amplified envelope variation from the predetermined value.

Note that as the shift amount control circuit 30 comprises the phase difference detection circuit 31 for detecting the phase difference between the input signal Sin input and the output signal Sout and generating the detected phase difference signal Sd having a voltage in accordance with the detected phase difference, and the voltage shift circuit 32 for adding the predetermined voltage shift signal Se and the detected phase difference signal Sd to thereby generate the shift amount control signal Sc. With the above, it is possible to shift the voltage of the detected phase difference signal Sd having a voltage in accordance with the phase difference between the input signal Sin and the output signal Sout to thereby convert into the shift amount control signal Sc having the optimum voltage for controlling the shift amount by the shift amount control circuit 30. Therefore, it is also possible to ensure a sufficiently large shift amount by the shift amount control circuit 30 according to the phase difference between the input signal Sin and the output signal Sout.

In addition, as a power amplification device in this embodiment has the gain control circuit 40 for controlling the gains of the first adder circuit 11a and the second adder circuit 11b, based on the first detected amplitude signal Sb1 and the second detected amplitude signal Sb2, respectively, it is possible to control the gains of the first adder circuit 11a and the second adder circuit 11b according to the amplitudes of the first amplified signal Sa1 and the second amplified signal Sa2, respectively, to thereby adjust the amplitudes (constant envelope vector strength) of the first amplified signal Sa1 and the second amplified signal Sa2. With the above, it is thus possible to obtain the second effect, that is, an effect of matching the amplitude of the first amplified signal Sa1 to that of the second amplified signal Sa2. Therefore, it is also possible to reduce the deviation of the amplitude and phase of the output signal Sout having amplified envelope variation from the predetermined value.

Note that the first detected amplitude signal Sb1 has a voltage in accordance with the amplitude of the first amplified signal Sa1, that the second detected amplitude signal Sb2 has a voltage in accordance with the amplitude of the second amplified signal Sa2, and that the gain control circuit 40 receives the first detected amplitude signal Sb1 and the second detected amplitude signal Sb2 and generates the first gain control signal Sg1 and the second gain control signal Sg2, the first gain control signal Sg1, which is used for controlling the gain of the first adder circuit 11a, has a voltage obtained by subtracting the voltage of the first detected amplitude signal Sb1 from a predetermined reference voltage, and the second gain control signal Sg2, which is used for controlling the gain of the second adder circuit 11b, has a voltage obtained by subtracting the voltage of the second detected amplitude signal Sb2 from the predetermined reference voltage. Therefore, it is possible to have the amplitude of the first amplified signal Sa1 matched to that of the second amplified signal Sa2, using a simple circuit.

In addition, as a power amplification device in this embodiment has the second amplitude control circuit 50 for changing the amplitude of the first constant envelope vector generating signal e and the second constant envelope vector generating signal −e, based on the amplitude of the input signal Sin and that of the output signal Sout, it is possible to obtain the third effect, that is, an effect of matching the amplitude of the output signal Sout to a predetermined value by changing the amplitude of the first constant envelope vector generating signal e and that of the second constant envelope vector generating signal −e according to the magnitude of the amplitude of the output signal Sout relative to the amplitude of the input signal Sin. With the above, it is possible to reduce the deviation of the amplitude and phase of the output signal Sout having amplified envelope variation from the predetermined value.

Note that as the second amplitude control circuit 50 comprises the input amplitude detection circuit 51 for detecting the amplitude of the input signal Sin and generating the detected input amplitude signal Sh having a voltage in accordance with the amplitude of the input signal Sin, the output amplitude detection circuit 52 for detecting the amplitude of the output signal Sout and generating the detected output amplitude signal Sk having a voltage in accordance with the amplitude of the output signal Sout, the attenuation circuit 53 for outputting the second detected output amplitude signal Sm obtained by attenuating the detected output amplitude signal Sk by a predetermined amount, and the amplitude control signal generating circuit 54 for receiving the detected input amplitude signal Sh and the second detected output amplitude signal Sm and generating the amplitude control signal Sn which has a voltage obtained by subtracting the voltage of the second detected output amplitude signal Sm from that of the detected input amplitude signal Sh, the amplitude control signal Sn is used for controlling the amplitude of the first constant envelope vector generating signal e and that of the second constant envelope vector generating signal −e. With the above, it is possible to have the amplitude of the output signal Sout matched to a predetermined value, using a simple circuit.

As described above, a power amplification device in this embodiment can obtain all of the above described first to third effects. Therefore, in an amplification device for converting the input signal Sin having envelope variation into two constant envelope signals having a phase difference in accordance with the amplitude of the input signal Sin and amplifying and then vector-adding the respective constant envelope signals to thereby obtain the output signal Sout having amplified envelope variation, it is possible to prevent deviation of the amplitude and phase of the output signal Sout having amplified envelope variation from the predetermined value.

[Second Embodiment]

Figure 5:
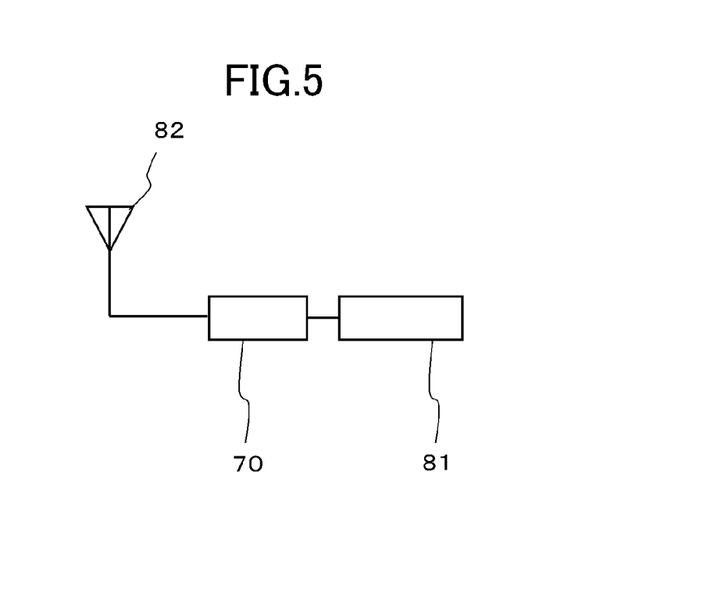
FIG. 5 is a block diagram schematically showing one example of a transmission device using a power amplification device according to an embodiment of the present invention.

FIG. 5 is a block diagram showing an example structure of a transmission device using a power amplification device according to the present invention.

In a transmission device in this embodiment, an antenna 82 is connected to a transmission circuit 81 via the power amplification device 70 of the present invention. As a transmission device in this embodiment can amplify a transmission signal by using the power amplification device 70 according to the present invention having a function of preventing deviation of the amplitude and phase of the output signal from a predetermined value, it is possible to prevent increase of error in data to be sent from the transmission device.

[Third Embodiment]

Figure 6:
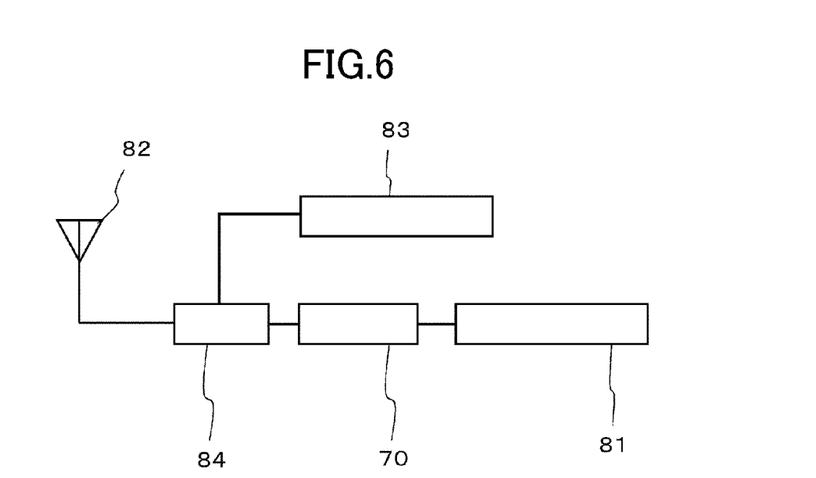
FIG. 6 is a block diagram schematically showing one example of a communication device using a power amplification device according to an embodiment of the present invention.

FIG. 6 is a block diagram showing an example structure of a communication device using a power amplification device according to the present invention.

In a communication device in this embodiment, the antenna 82 is connected to the transmission circuit 81 via the power amplification device 70 of the present invention, and a receiving circuit 83 is connected to the antenna 82. In addition, an antenna sharing circuit 84 is connected between the antenna 82 and the transmission circuit 81 and the receiving circuit 83. As a communication device in this embodiment can amplify a transmission signal by using the power amplification device 70 of the present invention having a function of preventing deviation of the amplitude and phase of the output signal from a predetermined value, it is possible to prevent increase of error in data to be sent from the communication device.

[Modified Embodiment]

The present invention is not limited to the above described embodiments, and can be modified and improved in various manners without departing from the gist of the present invention.

For example, although it is described that the shift amount of the variable phase shifter circuit 10 is controlled by using the detected phase difference signal Sd having a DC voltage in accordance with the phase difference between the input signal Sin and the output signal Sout in the power amplification devices in the above described embodiments, the shift amount of the variable phase shifter circuit 10 may be controlled by using a detected phase difference signal Sd having a current in accordance with the phase difference between the input signal Sin and the output signal Sout.

In addition, although it is described that the gains of the first adder circuit 11a and the second adder circuit 11b are controlled by using the first gain control signal Sg1 having a voltage obtained by subtracting the voltage of the first detected amplitude signal Sb1 from a reference voltage and a second gain control signal Sg2 having a voltage obtained by subtracting the voltage of the second detected amplitude signal Sb2 from the reference voltage in the power amplification devices in the above described embodiments, a first gain control signal Sg1 having a voltage obtained by adding the voltage of the first detected amplitude signal Sb1 and the reference voltage and a second gain control signal Sg2 having a voltage obtained by adding the voltage of the second detected amplitude signal Sb2 and the reference voltage may be used instead. Further alternatively, a first gain control signal Sg1 having a current obtained by subtracting the current of the first detected amplitude signal Sb1 from a reference current and a second gain control signal Sg2 having a current obtained by subtracting the current of the second detected amplitude signal Sb2 from the reference current may be used instead.

Further, although it is described that the amplitude of the first constant envelope vector generating signal e and that of the second constant envelope vector generating signal −e are controlled by using the detected input amplitude signal Sh having a voltage in accordance with the amplitude of the input signal Sin and the detected output amplitude signal Sk having a voltage in accordance with the amplitude of the output signal Sout in the power amplification devices according to the above described embodiments, the amplitude of the first constant envelope vector generating signal e and that of the second constant envelope vector generating signal −e may be controlled by using a detected input amplitude signal Sh having a current in accordance with the amplitude of the input signal Sin and a detected output amplitude signal Sk having a current in accordance with the amplitude of the output signal Sout.

The invention claimed is:

1. A power amplification device, comprising:
   a variable phase shifter circuit for changing a phase of an input signal having envelope variation to thereby generate a base signal;
   a first adder circuit for vector-adding a first constant envelope vector generating signal having a phase advanced by $\pi/2$ from the base signal to the base signal to thereby generate a first constant envelope signal;
   a second adder circuit for vector-adding a second constant envelope vector generating signal having a phase delayed by $\pi/2$ from the base signal to the base signal to thereby generate a second constant envelope signal;
   a first amplifier circuit for amplifying the first constant envelope signal to thereby generate a first amplified signal;
   a second amplifier circuit for amplifying the second constant envelope signal to thereby generate a second amplified signal;
   a first amplitude detection circuit for detecting an amplitude of the first amplified signal and generating a first detected amplitude signal;
   a second amplitude detection circuit for detecting an amplitude of the second amplified signal and generating a second detected amplitude signal;
   a first amplitude control circuit for changing an amplitude of the first constant envelope vector generating signal and an amplitude of the second constant envelope vector generating signal, based on the first detected amplitude signal and the second detected amplitude signal, respectively;
   an output adder circuit for vector-adding the first amplified signal and the second amplified signal to thereby generate an output signal having amplified envelope variation; and
   a shift amount control circuit for detecting a phase difference between the input signal and the output signal and generating a shift amount control signal for controlling a shift amount by the variable phase shifter circuit according to the phase difference.

2. The power amplification device according to claim 1, wherein
   the shift amount control circuit comprises
      a phase difference detection circuit for detecting a phase difference between the input signal input and the output signal and generating a detected phase difference signal having a voltage in accordance with the phase difference, and a voltage shift circuit for adding a predetermined voltage shift signal and the detected phase difference signal to thereby generate the shift amount control signal.

3. The power amplification device according to claim 1, further comprising a gain control circuit for controlling gains of the first adder circuit and the second adder circuit, based on the first detected amplitude signal and the second detected amplitude signal.

4. The power amplification device according to claim 3, wherein the first detected amplitude signal has a voltage in accordance with an amplitude of the first amplified signal, the second detected amplitude signal has a voltage in accordance with an amplitude of the second amplified signal, and the gain control circuit receives the first detected amplitude signal and the second detected amplitude signal, and generates a first gain control signal and a second gain control signal, the first gain control signal, which is used for controlling the gain of the first adder circuit, has a voltage obtained by subtracting a voltage of the first detected amplitude signal from a predetermined reference voltage, and the second gain control signal, which is used for controlling the gain of the second adder circuit, has a voltage obtained by subtracting a voltage of the second detected amplitude signal from the predetermined reference voltage.

5. The power amplification device according to claim 1, further comprising a second amplitude control circuit for changing an amplitude of the first constant envelope vector generating signal and an amplitude of the second constant envelope vector generating signal, based on an amplitude of the input signal and an amplitude of the output signal.

6. The power amplification device according to claim 5, wherein the second amplitude control circuit comprises an input amplitude detection circuit for detecting the amplitude of the input signal and generating a detected input amplitude signal having a voltage in accordance with the amplitude of the input signal, an output amplitude detection circuit for detecting the amplitude of the output signal and generating a detected output amplitude signal having a voltage in accordance with the amplitude of the output signal, an attenuation circuit for outputting a second detected output amplitude signal obtained by attenuating the detected output amplitude signal by a predetermined percentage, and an amplitude control signal generating circuit for receiving the detected input amplitude signal and the second detected output amplitude signal, and generating an amplitude control signal having a voltage obtained by subtracting a voltage of the second detected output amplitude signal from a voltage of the detected input amplitude signal, the amplitude control signal is used for controlling an amplitude of the first constant envelope vector generating signal and an amplitude of the second constant envelope vector generating signal.

7. A transmission device, comprising:

a transmission circuit;

the power amplification device according to claim 1; and an antenna connected to the transmission circuit via the power amplification device.

8. A communication device, comprising:

a transmission circuit;

the power amplification device according to claim 1;

an antenna connected to the transmission circuit via the power amplification device; and a receiving circuit connected to the antenna.

* * * * *